(12) United States Patent
Ui et al.

(10) Patent No.: US 7,157,756 B2
(45) Date of Patent: Jan. 2, 2007

(54) FIELD EFFECT TRANSISTOR

(75) Inventors: Norihiko Ui, Yamanashi (JP);
Kazutaka Inoue, Yamanashi (JP);
Kazuo Nambu, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 28 days.

(21) Appl. No.: 10/618,717

(22) Filed: Jul. 15, 2003

(65) Prior Publication Data

US 2004/0016965 A1   Jan. 29, 2004

(30) Foreign Application Priority Data

Jul. 16, 2002   (JP)   ............... 2002-206774

(51) Int. Cl.
*H01L 29/80*   (2006.01)
(52) U.S. Cl. ..................................... 257/285
(58) Field of Classification Search ............... 257/285, 257/286
See application file for complete search history.

(56) References Cited

U.S. PATENT DOCUMENTS 4,641,161 A * 2/1987 Kim et al. .................. 257/192
5,493,136 A * 2/1996 Matsuzaki et al. .......... 257/287
6,333,523 B1 * 12/2001 Sakamoto et al. .......... 257/192

FOREIGN PATENT DOCUMENTS

| JP | 58-147161 | 9/1983 |
|----|-----------|--------|
| JP | 60-223171 | 11/1985 |
| JP | 61-184887 | 8/1986 |
| JP | 1-143270 | 6/1989 |
| JP | 5-74813 | 3/1993 |
| JP | 6-310535 | 11/1994 |
| JP | 7-249780 | 9/1995 |
| JP | 2002-176169 | 6/2002 |

OTHER PUBLICATIONS

Japanese Office Action dated Dec. 14, 2004.

* cited by examiner

*Primary Examiner*—Zandra V. Smith
*Assistant Examiner*—Kiesha Rose
(74) *Attorney, Agent, or Firm*—Armstrong, Kratz, Quintos, Hanson & Brooks, LLP

(57) ABSTRACT

A field-effect transistor includes a channel layer that is formed on a predetermined semiconductor layer and has an impurity concentration varying from a low value to a high value, and a source region and a drain region each having a bottom face above the predetermined semiconductor layer.

8 Claims, 8 Drawing Sheets

FIELD EFFECT TRANSISTOR

BACKGROUND OF THE INVENTION

1. Field of the Invention

The present invention generally relates to a field-effect transistor and a method of producing the field-effect transistor, and more particularly, to a field-effect transistor with reduced third harmonic distortion and a method of producing the field-effect transistor.

2. Description of the Related Art

At present, field-effect transistors (FETs) are being used as power amplifying devices for portable telephone base stations. FIG. 1 illustrates the transconductance (gm) profile (a Vg-Gm characteristic curve) of a conventional field-effect transistor.

As can be seen from FIG. 1, the gm profile of the conventional field-effect transistor has a flat part in the area where gate-source voltage Vgs exists. In accordance with a conventional technique using a field-effect transistor in class-A operation, it is preferable that the flat part shown in FIG. 1 exists in the gm profile in the operation area (the class-A operation area in FIG. 1), because the transconductance (gm) should ideally be constant in class-A operation.

In recent years, field-effect transistors are more often used in class-AB operation (see FIG. 1), to increase the power amplifying efficiency. In class-AB operation, a curved part of the gm profile is utilized.

With the class-AB operation area, however, there is a problem that the third order intermodulation distortion (IM3) increases due to the nonlinear gm profile. It is considered that the nonlinearity is caused by the constant impurity concentration in the channel part of the field-effect transistor.

SUMMARY OF THE INVENTION

It is therefore an object of the present invention to provide a field-effect transistor and a method of producing the field-effect transistor in which the above disadvantage is eliminated.

A more specific object of the present invention is to provide a field-effect transistor that has third order intermodulation distortion (IM3) reduced with a linear gm profile, and a method of producing such a field-effect transistor.

The above objects of the present invention are achieved by a field-effect transistor comprising: a channel layer that is formed on a predetermined semiconductor layer and has an impurity concentration varying from a low value to a high value; and a source region and a drain region each having a bottom face above the predetermined semiconductor layer. The impurity concentration of the channel layer varies from a low value to a high value and the bottoms of the source region and the drain region are located above the predetermined semiconductor layer (which is, for example, a buffer layer on a semiconductor substrate), so that the linear gm profile can be realized without adverse influence of the predetermined semiconductor layer and the field effect transistor having reduced third intermodulation distortion (IM3) can be provided.

The above objects of the present invention are also achieved by a field-effect transistor comprising: a channel layer that is formed on a predetermined semiconductor layer and has a composition ratio varying from a low value to a high value; and a source region and a drain region each having a bottom face above the predetermined semiconductor layer. The composition ratio of the channel layer varies from a low value to a high value and the bottoms of the source region and the drain region are located above the predetermined semiconductor layer, so that the linear gm profile can be realized without adverse influence of the predetermined semiconductor layer and the field effect transistor having reduced third intermodulation distortion (IM3) can be provided.

The above objects of the present invention are also achieved by a method of producing a field-effect transistor, comprising the steps of: growing a channel layer on a predetermined semiconductor layer, while varying an impurity concentration from a low value to a high value; and forming a source region and a drain region each having a bottom face above the predetermined semiconductor layer.

The above objects of the present invention are also achieved by a method of producing a field-effect transistor, comprising the steps of: growing a channel layer on a predetermined semiconductor layer, while varying the composition ratio of a predetermined composition from a low value to a high value; and forming a source region and a drain region each having a bottom face above the predetermined semiconductor layer.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS (Principles of the Invention)

First, a description will be given of the principles of the present invention.

The present invention provides a field-effect transistor that includes a channel layer that is formed on a predetermined semiconductor layer (a buffer layer, for example) and has an impurity concentration varying from a low level to a high level, and a source region and a drain region each having a bottom face above the predetermined semiconductor layer. The present invention also provides a field-effect transistor that includes a channel layer that is formed on a predetermined semiconductor layer (a buffer layer, for example) and has a composition ratio varying from a low value to a high value, and a source region and a drain region each having a bottom face above the predetermined semiconductor layer. The present invention further provides methods of producing these field-effect transistors.

Figure 1:
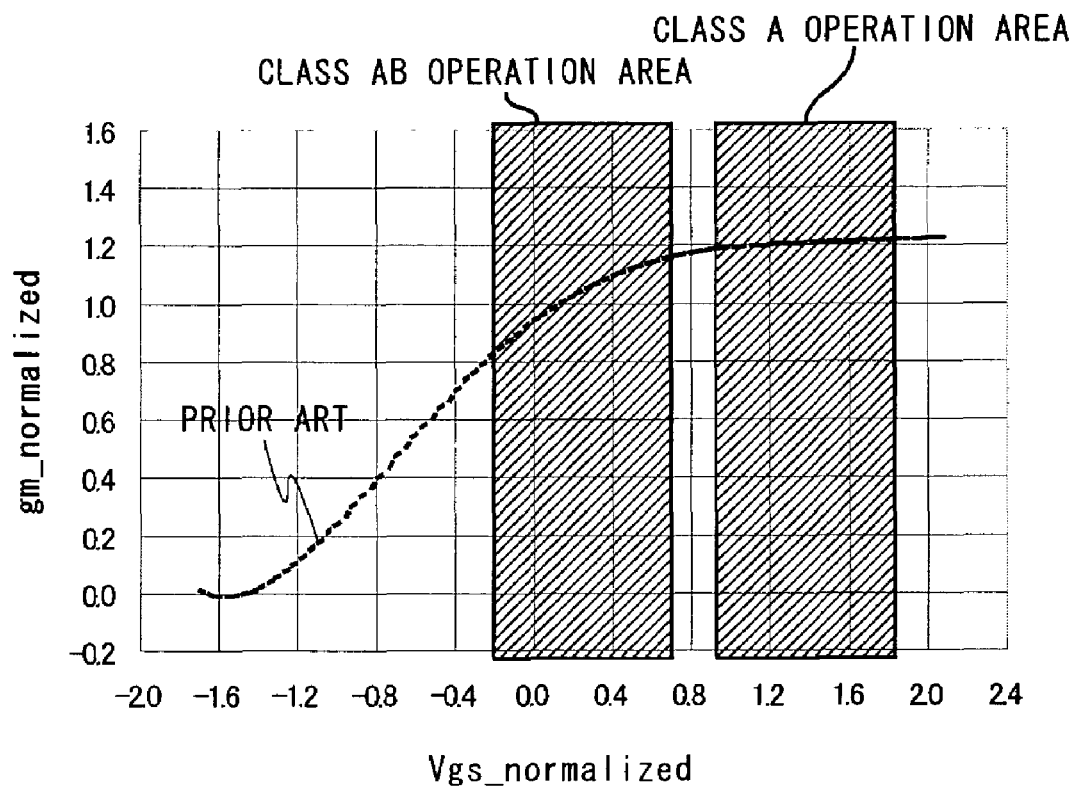
FIG. 1 is a graph illustrating an example of a gm profile of a conventional field-effect transistor.
Figure 2:
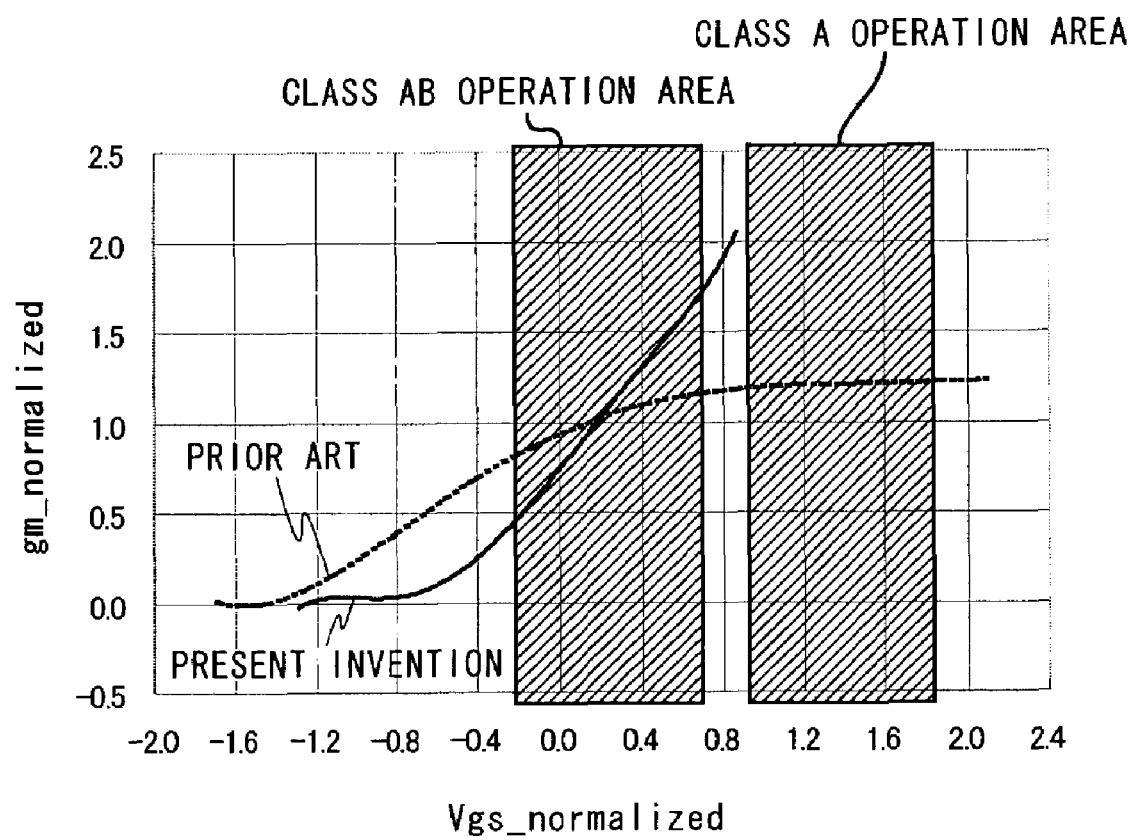
FIG. 2 is a graph illustrating an example of a gm profile of a field-effect transistor in accordance with the present invention.

With either of the above field-effect transistors of the present invention, the third order intermodulation distortion (IM3) in the class-AB operation area can be eliminated. This is because the impurity concentration or the composition of the channel layer is continuously varied, so that the linearity of the gm profile can be realized, as shown in FIG. 2, without adverse influence of the predetermined semiconductor layer.

The following is a detailed description of embodiments of the present invention, with reference to the accompanying drawings.

(First Embodiment)

Figure 3:
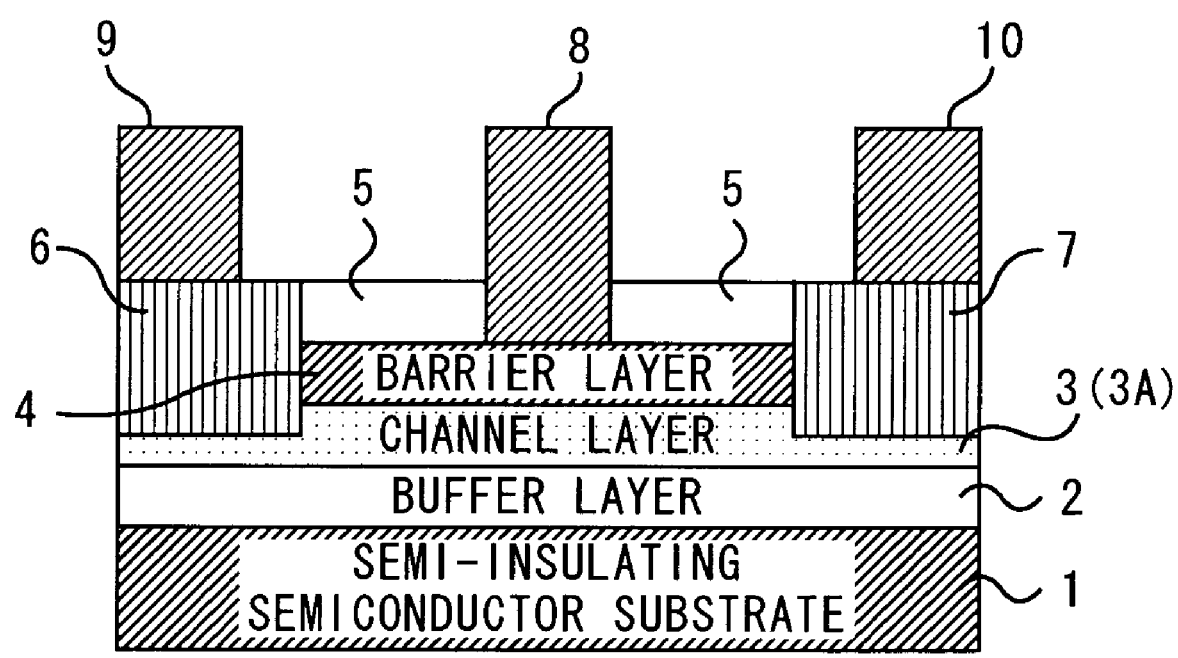
FIG. 3 is a section view of the layer structure of a field-effect transistor in accordance with a first embodiment of the present invention.

FIG. 3 is a section view of the layer structure of a field-effect transistor in accordance with a first embodiment of the present invention.

As can be seen from FIG. 3, the field-effect transistor of this embodiment includes a semi-insulating semiconductor substrate 1 and a channel layer 3 that is interposed between a buffer layer 2 and a barrier layer 4 above the semi-insulating semiconductor substrate 1. In this structure, the channel layer 3 is located on the side of one of the two planes of the semi-insulating semiconductor substrate 1. This field-effect transistor is produced through metal organic vapor phase epitaxy (MOVPE).

Figure 4:
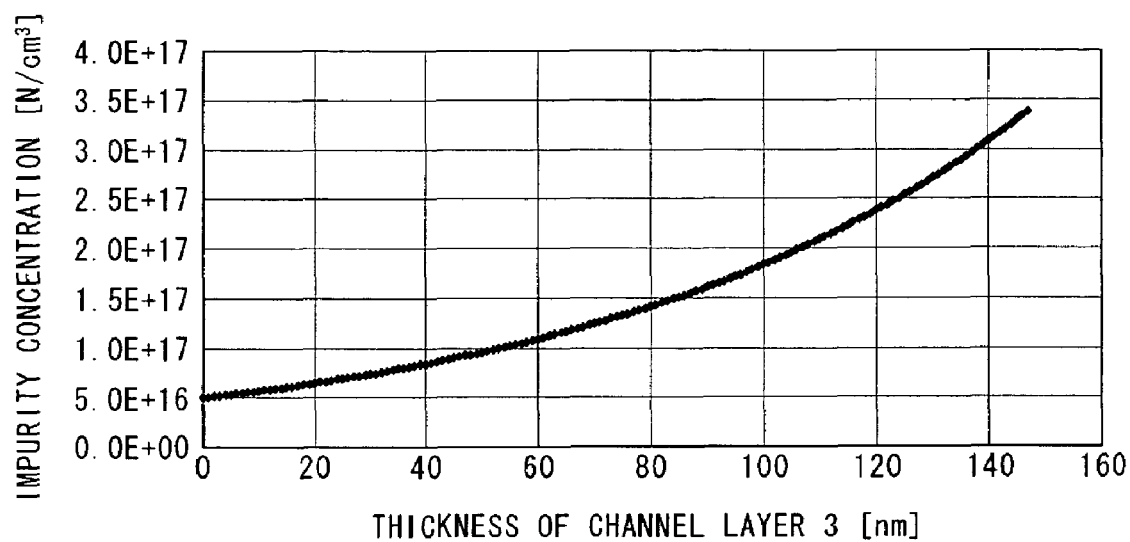
FIG. 4 is a graph illustrating the profile of the impurity concentration in the channel layer that is grown while the flow rate of the impurity gas is exponentially increased in accordance with the first embodiment of the present invention.

Referring to FIG. 4, the channel layer 3 has a doped impurity concentration that depends on the depth (i.e., the thickness (nm) of the channel layer 3). Accordingly, the channel layer 3 has an impurity concentration that becomes higher toward the barrier layer 4 from the semi-insulating semiconductor substrate 1 (or the buffer layer 2). In other words, the channel layer 3 is grown on the buffer layer 2 on the side of one plane of the semi-insulating semiconductor substrate 1, with the impurity concentration varying from a low level to a high level. In this embodiment utilizing the MOVPE process, the flow rate of the gas containing the impurity to be incorporated into the channel layer 3 that is being grown (the gas will be hereinafter referred to as the impurity gas, which is equivalent to a doping gas) is continuously increased with the growth (or with time), so as to form the channel layer 3 that has the above described characteristics.

The flow rate of the impurity gas used for growing the channel layer 3 can be increased linearly or exponentially, for example. FIG. 4 is a graph illustrating the depth dependency of the impurity concentration of the channel layer 3 that is exponentially increased. As is apparent from FIG. 4, the thickness of the channel layer 3 is approximately 150 nm, and the impurity concentration of the channel layer 3 varies from approximately $5.0 \times 10^{16}$ N/cm$^3$ to approximately $3.4 \times 10^{17}$ N/cm$^3$ in the thickness direction (or the laminating direction, with the face of the semi-insulating semiconductor substrate 1 being the reference plane). In this embodiment, the lower limit of the impurity concentration is preferably $1.0 \times 10^{16}$ N/cm$^3$ or higher, and the layer thickness of the channel layer 3 is preferably 50 nm or thicker. However, these conditions can be changed, depending on the matters concerning design.

When a channel layer 3 of gallium arsenide (GaAs) is to be grown by the MOVPE process in this embodiment, it is possible to employ such compounds as monosilane (SiH$_4$), n-type disilane (Si$_2$H$_6$), or p-type tetrabromomethane (CBr$_4$) for the impurity gas. Here, the doped impurity is silicon (Si) or carbon (C).

In this embodiment, the bottom faces of the source region 6 and the drain region 7, which are the planes facing the semi-insulating semiconductor substrate 1, are located on the opposite side from the semi-insulating semiconductor substrate 1 with respect to the face of the channel layer 3 on the side of the semi-insulating semiconductor substrate 1. In short, the source region 6 and the drain region 7 of this embodiment are formed by implanting ions to such a depth that does not reach the face of the channel layer 3 on the side of the semi-insulating semiconductor substrate 1.

As the source region 6 and the drain region 7 are not in contact with the buffer layer 2, a steep rise in current on the boundary between the buffer layer 2 and the channel layer 3 can be prevented in this embodiment. More specifically, contact regions (the source region 6 and the drain region 7) extend to the middle of the channel layer 3 in the thickness direction, so that a steep rise in current can be prevented, and that the increase in the transconductance (gm) can be slowed down. A source electrode 9 that is made of a low-resistance metal such as gold (Au) is ohmic contact to the face of the source region 6 opposite from the semi-insulating semiconductor substrate 1. Likewise, a drain electrode 10 that is made of a low-resistance metal such as gold (Au) is ohmic contact to the face of the drain region 7 opposite from the semi-insulating semiconductor substrate 1. Further, a gate electrode 8 that is made of a low-resistance metal including as gold (Au) is Schottky contact to a predetermined area that is located on the barrier layer 4 and between the source region 6 and the drain region 7. A cap layer 5 is formed in an area on the barrier layer 4 and between the source region 6 and the drain region 7, where the gate electrode 8 does not exist.

The production process of a field-effect transistor having the above layer structure will be described below, with reference to the accompanying drawings. As described above, each of the layers (the buffer layer 2, the channel layer 3, the barrier layer 4, and the cap layer 5) is grown by MOVPE in this embodiment.

First, the buffer layer 2 is grown on the semi-insulating semiconductor substrate 1 that is placed in a chamber 11. The semi-insulating semiconductor substrate 1 is made of a semi-insulating GaAs (gallium arsenide) semiconductor material, for example. The buffer layer 2 is made of undoped aluminum gallium arsenide (undoped AlGaAs), for example.

Figure 6A:
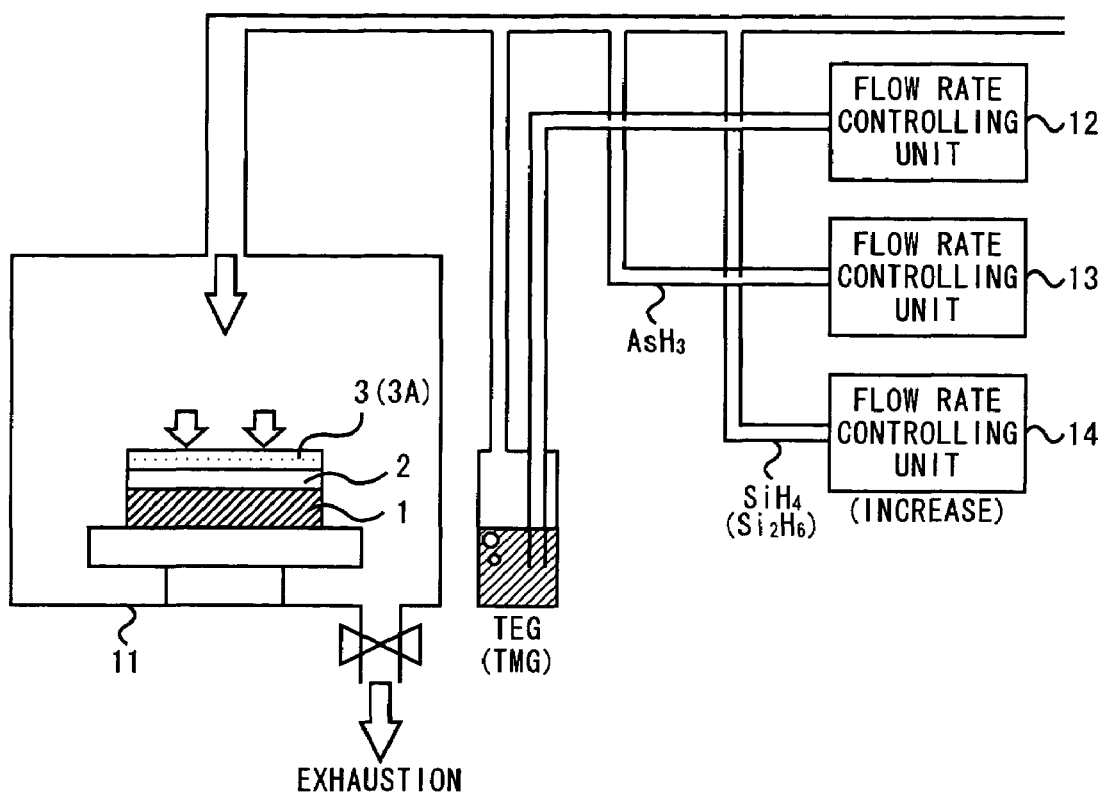
FIGS. 6A and 6B illustrate a production process of the field-effect transistor in accordance with the first embodiment of the present invention.

The channel layer 3 is next grown on the buffer layer 2 by MOVPE, as shown in FIG. 6A. In this embodiment, gallium (Ga) is used as a group III material, arsenic (As) is used as a group V material, and silicon (Si) is used as an impurity. More specifically, gallium is introduced by bubbling a liquid containing an organic metal, such as triethylgallium (TEG) or trimethylgallium (TMG), with a carrier gas. As for arsenic, arsine (AsH$_3$) is introduced, and, as for silicon, monosilane (SiH$_4$) or disilane (Si$_2$H$_6$) is introduced. By doing so, the n-type GaAs channel layer 3 doped with silicon (Si) is formed.

Here, the flow rate of the impurity gas is increased as the channel layer 3 grows (or as time passes). To achieve this, the flow rate of the carrier gas (a hydrogen gas, for example) is controlled or increased by a flow rate controlling unit 14. This increase of the flow rate is a linear increase or an exponential increase, as mentioned above. However, the flow rates of the other materials (TEG for Ga and AsH$_3$ for As), which are the material gases to be controlled by flow rate controlling units 12 and 13, are constant.

Through the above procedures, the channel layer 3 that has an impurity concentration varying from a low level to a high level can be grown on the side of one plane of the semi-insulating semiconductor substrate 1 (i.e., on the buffer layer 2). The profile of the impurity concentration shown in FIG. 4 was obtained when the flow rate of the impurity gas controlled by the flow rate controlling unit 14 was exponentially increased.

Figure 5A:
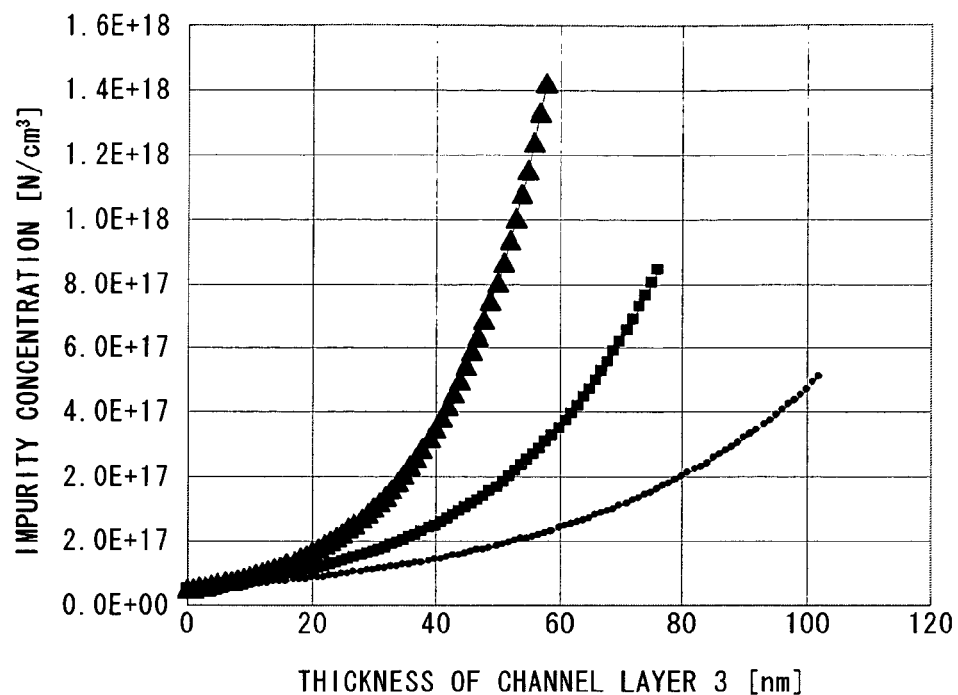
FIGS. 5A and 5B show profiles of the impurity concentration in the channel layer regarding three different thicknesses in accordance with the first embodiment of the present invention.
Figure 5B:
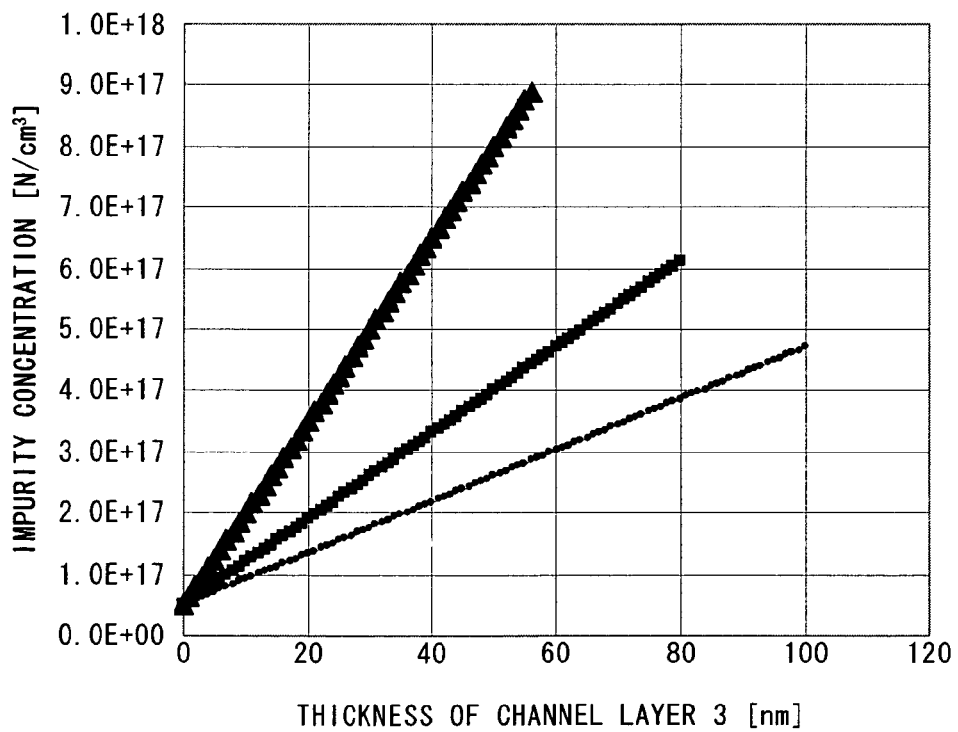

FIGS. 5A and 5B illustrate the other profile examples of impurity concentrations in the channel layer 3. In the example cases shown in FIGS. 5A and 5B, the impurity concentration on the side of the semi-insulating semiconductor substrate 1 (the side of the buffer layer 2) is $5.0 \times 10^{16}$, the thicknesses of the channel layer 3 are 60 nm, 80 nm, and 100 nm, and the impurity concentration (the flow rate of the impurity gas) is exponentially (see FIG. 5A) or linearly (see FIG. 5B) varied. These examples shown in FIGS. 5A and 5B are typical cases where a channel layer made of gallium arsenide (GaAs) is grown.

The barrier layer 4 and the cap layer 5 are then grown in this order on the channel layer 3 formed in the above manner. The barrier layer 4 is made of undoped aluminum gallium arsenide (undoped AlGaAs), for example. The cap layer 5 is made of undoped gallium arsenide (undoped GaAs), for example.

Figure 6B:
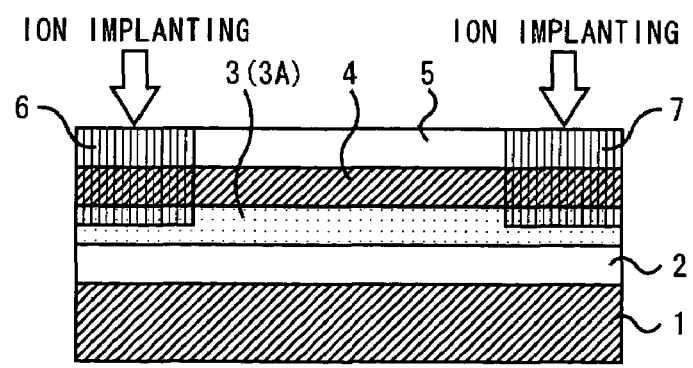

After that, ions are implanted down to the middle of the channel layer 3 through the surface of the cap layer 5 by an ion implanting technique, as shown in FIG. 6B. This can be done by adjusting the implantation energy.

In this manner, the source region 6 and the drain region 7, which have the substrate side planes on the opposite side from the semi-insulating semiconductor substrate 1 with respect to the substrate side plane (i.e., the bottom face) of the channel layer 3, are formed. The doping material to be implanted into the source region 6 and the drain region 7, which are N+ regions, is an n-type material such as silicon (Si).

In this embodiment, after the formation of the source region 6 and the drain region 7, annealing may be performed to activate the impurity. In this case, the annealing is performed through the surfaces of the cap layer 5, the source region 6, and the drain region 7.

Ohmic electrodes (the source electrode 9 and the drain electrode 10) made of a low-resistance metal such as gold (Au) are then formed on the source region 6 and the drain region 7 formed in the above manner. Heat treatment is then carried out to establish the ohmic bonding between the source region 6 and the source electrode 9, and between the drain region 7 and the drain electrode 10.

Etching is then performed, using a photoresistor, for example, on a predetermined region of the cap layer 5, so that a Schottky electrode (the gate electrode 8) made of a low-resistance metal including gold (Au) is formed on the predetermined region.

(Second Embodiment)

Although the channel layer 3 is grown by MOVPE in the first embodiment, it is also possible to grow a channel layer by molecular beam epitaxy (MBE). In the following, an example case where the channel layer 3 and the other layers are formed by the MBE process will be described as a second embodiment of the present invention.

In the first embodiment, the flow rate of the impurity gas is controlled by the flow rate controlling unit 14 in MOVPE system and the impurity is linearly or exponentially increased during the growth of the channel layer 3 (or with time), so that the impurity concentration of the channel layer 3 varies from a low level to a high level in the thickness direction. In this embodiment, on the other hand, the temperature of an effusion cell 15 for an impurity material (Si) is lineally or exponentially increased during the growth of the channel layer 3 that is being grown by the MBE process. By doing so, the Si molecular beam intensity is varied, and the same channel layer 3 as that of the first embodiment can be formed.

Figure 7:
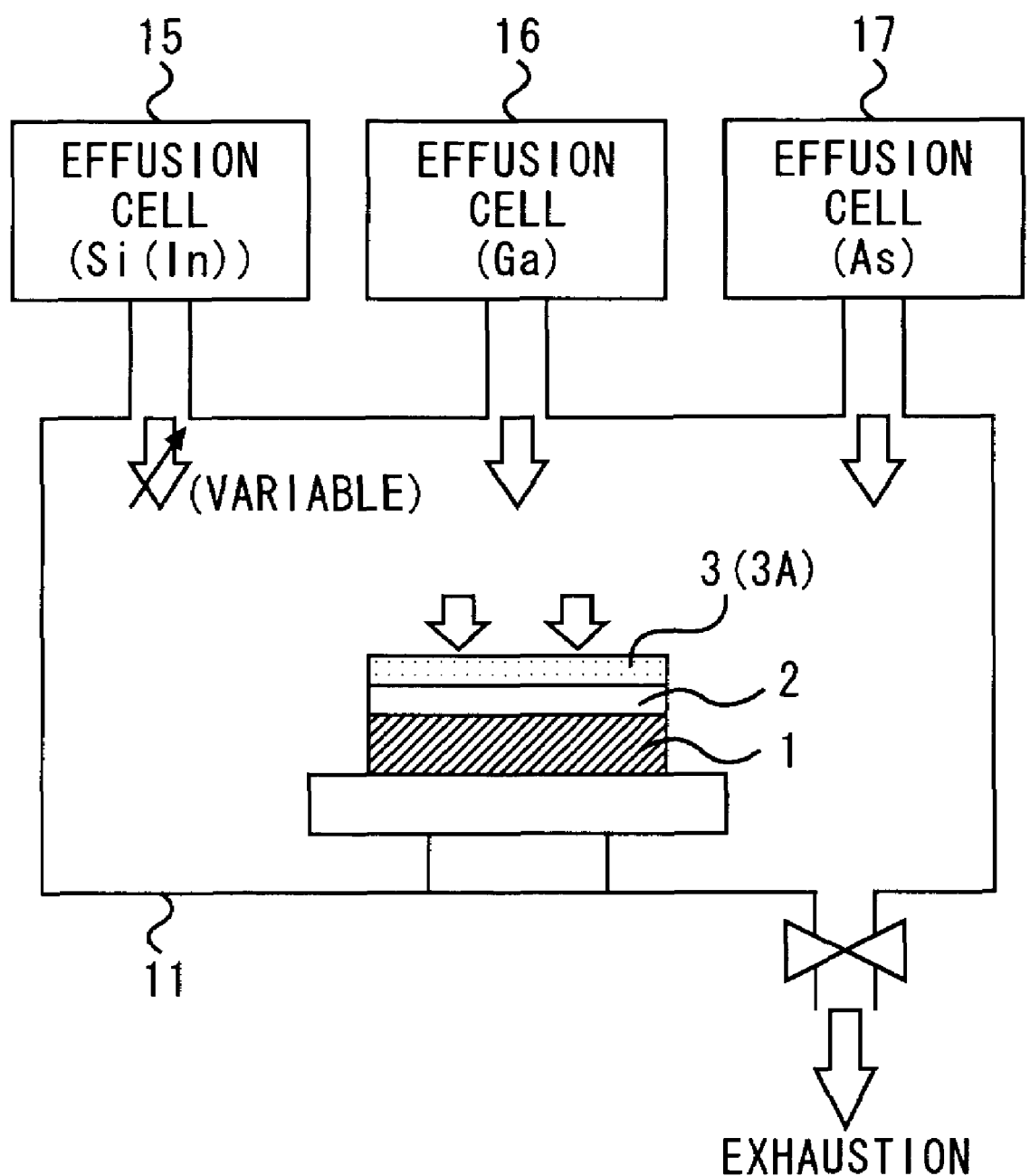
FIG. 7 illustrates a production process of a field-effect transistor in accordance with a second embodiment of the present invention.

FIG. 7 illustrates the second embodiment in detail. In this embodiment, the channel layer 3 is made of GaAs doped with silicon (Si) as the impurity.

As can be seen from FIG. 7, an effusion cell 16 for gallium (Ga), an effusion cell 17 for arsenic (As), and the effusion cell 15 for silicon (Si), are employed in this embodiment. These effusion cells emit Ga molecular beams, As molecular beams, and Si molecular beams (dopants), respectively, onto the substrate.

Here, the temperature of the effusion cell 15 for silicon (Si), which is the impurity material, is increased as the channel layer 3 grows (or as time passes). As mentioned above, this increase is a linear or exponential increase. Through this procedure, the Si molecular beam intensity is varied, and the Si impurity concentration in the GaAs is varied. As a result, the channel layer 3 that has an impurity concentration varying from a low level to a high level can be grown on the side of one of the two planes of the semi-insulating semiconductor substrate 1 (i.e., on the buffer layer 2). In the above example, silicon, which is an n-type material, is employed as the impurity material. However, it is also possible to employ a p-type material such as beryllium (Be) or magnesium (Mg), or another n-type material such as selenium (Se).

The structure and the process in accordance with the second embodiment are the same as those in accordance with the first embodiment, except that MBE is utilized instead of MOVPE. Thus, a field-effect transistor having the same effects as those of the first embodiment can be produced.

(Third Embodiment)

Although the impurity concentration in the channel layer 3 is varied from a low level to a high level in the first embodiment, it is also possible to vary the composition ratio of a predetermined organic metal from a low value to a high value. In the following, such a case will be described as a third embodiment of the present invention.

The layer structure of a field-effect transistor in accordance with this embodiment is the same as the layer structure in accordance with the first embodiment shown in FIG. 3, except that the channel layer 3 is replaced with a channel layer 3A. In this embodiment, each layer is grown by MOVPE, which is the same as in the first embodiment.

The procedures up to the stage of growing the buffer layer 2 on the semi-insulating semiconductor substrate 1 are the same as those in the first embodiment. In this embodiment, the channel layer 3A is grown, using two types of materials. The two types of material gases are MO gases.

One of the two types of material gases is trimethylgallium (TMG) and/or triethylgallium (TEG), while the other one is trimethylindium (TMI) and/or triethylindium (TEI), for example.

In this embodiment, the flow rate of the MO gas of TMI (or TEI) is continuously increased with the growth of the channel layer 3A (or with time), and the channel layer 3A is grown by MOVPE. This continuous increase is a linear or exponential increase, as described above. Through this procedure, the channel layer 3A having a composition that varies the saturation electron velocity from a low level to a high level is grown on the side of one face of the semi-insulating semiconductor substrate 1 (i.e., on the buffer layer 2). In other words, the channel layer 3A has the In composition ratio that linearly or exponentially decreases toward the semi-insulating semiconductor substrate 1. The procedures after the formation of the channel layer 3A are the same as those of the first embodiment, and therefore, explanation of them is omitted herein.

It is also possible to epitaxially grow the channel layer 3A by continuously reducing the flow rate of-the MO gas of TMG (or TEG) with the growth of the channel layer 3A (or with time). This continuous reduction is a linear or exponential decrease, as mentioned above.

Figure 8:
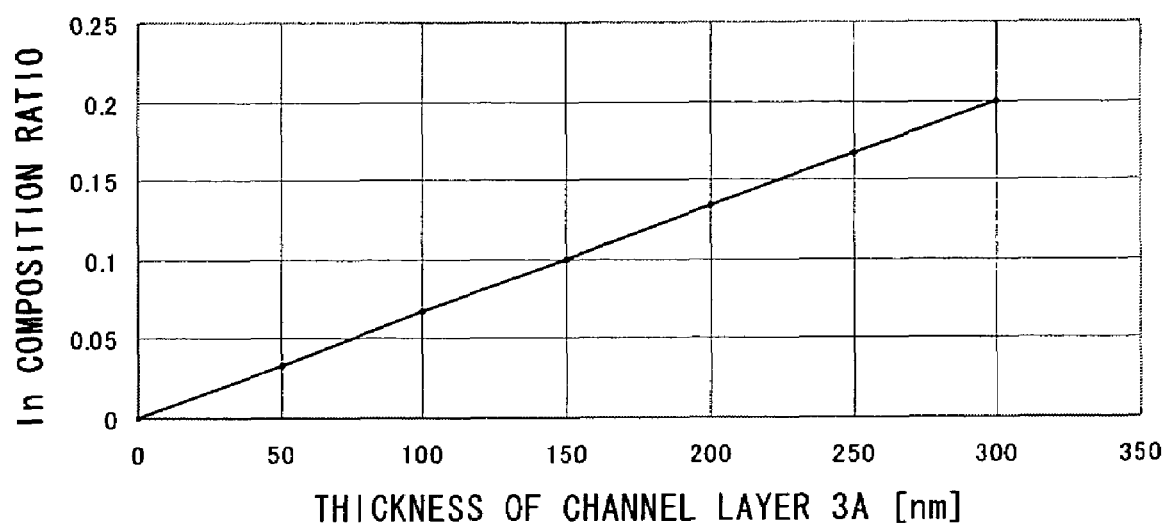
FIG. 8 is a graph illustrating the profile of an In composition ratio in accordance with a third embodiment of the present invention.

As an example, FIG. 8 shows the profile of the In composition ratio in a case where the flow rate of the MO gas of trimethylindium (TMI) is linearly increased, or where the flow rate of the MO gas of trimethylgallium (TMG) and/or triethylgallium (TEG) is linearly reduced.

In this embodiment, the channel material may be InGaN, InGaP, InAlAs, InAlN, or AlInP, for example, as well as the above described InGaAs, which has the In composition decreasing with the depth in the thickness direction. It is also possible to employ GaAsSb or AlGaAs as the channel material. However, when GaAsSb is employed, the channel layer 3A has the Sb composition ratio linearly or exponentially decreasing toward the semi-insulating semiconductor substrate 1. When AlGaAs is employed, the channel layer 3A has the Al composition ratio linearly or exponentially increasing toward the semi-insulating semiconductor substrate 1. However, the raw materials to be employed here can be changed according to the channel material or the impurity material.

Through the above procedures, a field-effect transistor, in which the channel layer 3A having a composition ratio varying the saturation electron speed from a low level to a high level is formed on the side of one of the faces of semi-insulating semiconductor substrate 1, can be produced.

(Fourth Embodiment)

Although the channel layer 3A is grown by MOVPE in the third embodiment, it is also possible to grow the channel layer 3A by molecular beam epitaxy (MBE). A structure for growing the channel layer 3A by MBE has another effusion cell for indium (In) in the structure shown in FIG. 7.

Also, to grow the channel layer 3A while varying the composition ratio of a predetermined organic metal (MO) by MOVPE, the flow rate of one of the two carrier gases is increased or decreased linearly or exponentially with the growth of the channel layer 3A (or with time) in the third embodiment. In this embodiment, on the other hand, the temperature of the effusion cell for indium (In) is linearly or exponentially increased during the growth of the channel layer 3A that is being grown by MBE, or the temperature of the effusion cell for gallium (Ga) is linearly or exponentially decreased. In the production procedures utilizing MBE in accordance with this embodiment, the effusion cells for In, Si, Ga, and As, are prepared, and the In supply is variably controlled. Thus, the same channel layer 3A as that of the third embodiment can be formed.

The structure and the production procedures in accordance with this embodiment are the same as those in accordance with the third embodiment, except MBE is utilized instead of MOVPE. In this manner, a field-effect transistor having the same effects as those of the third embodiment can be produced.

(Fifth Embodiment)

In the foregoing embodiments, the impurity concentration of the channel layer 3 or the In (Sb or Al) composition ratio of the channel layer 3A is linearly or exponentially varied during the layer growth utilizing MOVPE or MBE. However, it is also possible to grow a channel layer utilizing MOVPE or MBE, so that the impurity concentration or the composition ratio has such a profile that combines a linear profile, an exponential profile, and a constant profile. By doing so, a field-effect transistor can be freely designed to have characteristics suitable for any point in the thickness direction of the channel layer.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese Patent Application No. 2002-206774 filed on Jul. 16, 2002, the entire disclosure of which is hereby incorporated by reference.

What is claimed is:

1. A field-effect transistor comprising:
   a channel layer that is formed on a predetermined semiconductor layer and has an impurity concentration varying from a low value to a high value; and
   a source region and a drain region each having a bottom face located in said channel layer, said bottom faces being above an interface between the predetermined semiconductor layer and the channel layer.

2. The field-effect transistor as claimed in claim 1, wherein the impurity concentration varies linearly or exponentially.

3. The field-effect transistor as claimed in claim 1, wherein the impurity concentration is $1.0 \times 10^{16}/cm^3$ or higher.

4. The field-effect transistor as claimed in claim 1, wherein the impurity contained in the channel layer is at least one of selenium, silicon, carbon, beryllium, and magnesium.

5. The field-effect transistor as claimed in claim 1, wherein:
   the predetermined semiconductor layer is a buffer layer that is formed on a semiconductor substrate; and
   the bottom faces of the source region and the drain region are located within the channel layer.

6. A field-effect transistor comprising:
   a channel layer that is formed on a predetermined semiconductor layer and has a composition that varies so that a saturation electron velocity varies from a low value to a high value as getting away from the predetermined semiconductor layer; and
   a source region and a drain region each having a bottom face located in said channel layer, said bottom faces being above an interface between the predetermined semiconductor layer and the channel layer.

7. The field-effect transistor as claimed in claim 6, wherein the channel layer has the composition ratio of a predetermined material linearly or exponentially decreasing or increasing as the distance from the predetermined semiconductor layer increases.

8. The field-effect transistor as claimed in claim 6, wherein the predetermined material is at least one of gallium, indium, aluminum, and antimony.

* * * * *